United States Patent
Bowen et al.

[11] Patent Number: 6,111,818
[45] Date of Patent: *Aug. 29, 2000

[54] LOW VOLTAGE PIEZOELECTRIC ACTUATOR

[75] Inventors: Leslie J. Bowen, Concord; Craig D. Near, Acton, both of Mass.

[73] Assignee: Materials Systems Inc., Concord, Mass.

[*] Notice: This patent is subject to a terminal disclaimer.

[21] Appl. No.: 09/080,746

[22] Filed: May 18, 1998

Related U.S. Application Data

[63] Continuation-in-part of application No. 08/847,435, Apr. 28, 1997, Pat. No. 5,841,736.

[51] Int. Cl.[7] .............................. H04R 17/00; H01L 41/08
[52] U.S. Cl. ........................ 367/140; 310/334; 310/358; 310/367; 310/369
[58] Field of Search ..................................... 367/140, 155, 367/157, 159; 310/334, 367, 369, 358

[56] References Cited

U.S. PATENT DOCUMENTS

| | | |
|---|---|---|
| 5,173,605 | 12/1992 | Hayes et al. . |
| 5,598,050 | 1/1997 | Bowen et al. . |
| 5,841,736 | 11/1998 | Bowen et al. ........................ 367/140 |

OTHER PUBLICATIONS

Q. M. Zhang et al., "Piezoelectric Tubes and Tubular Composites for Actuator and Sensor Applications," *J. Mat. Sci.* 28 (1993) 3962.

Q. M. Zhang et al., "Piezoelectric Tubes and 1–3 Type Tubular Composites as Tunable Actuators and Sensors," *SPIE vol. 1916* (1993) 244.

J. Chen et al., "Modeling and Design of 1–3 Tubular Composite for Smart Transducer Applications," *Proc. International Conf. Intelligent Mats.* (1994).

*Primary Examiner*—Ian J. Lobo
*Attorney, Agent, or Firm*—Frances P. Craig

[57] ABSTRACT

An actuator includes a ceramic body having a base and an array of tube-shaped or blade-pair-shaped piezoelectric or electrostrictive ceramic elements defining an enclosure and integral with the base. A first electrode contacts the inner surfaces of walls of the elements, while a second electrode contacts the wall outer surfaces. The actuator is driven for $d_{31}$ mode or $d_{15}$ mode vibration of the walls. The wall vibration is transmitted to a desired medium via a vibration transmission means, e.g., a compliant polymer filler material of Shore A30 to Shore D75 filling the enclosure and bonded to the walls. Alternatively, a stiff cover plate may be used to transmit the tube wall vibration to a desired medium. An acoustic sensor device is also described.

35 Claims, 12 Drawing Sheets

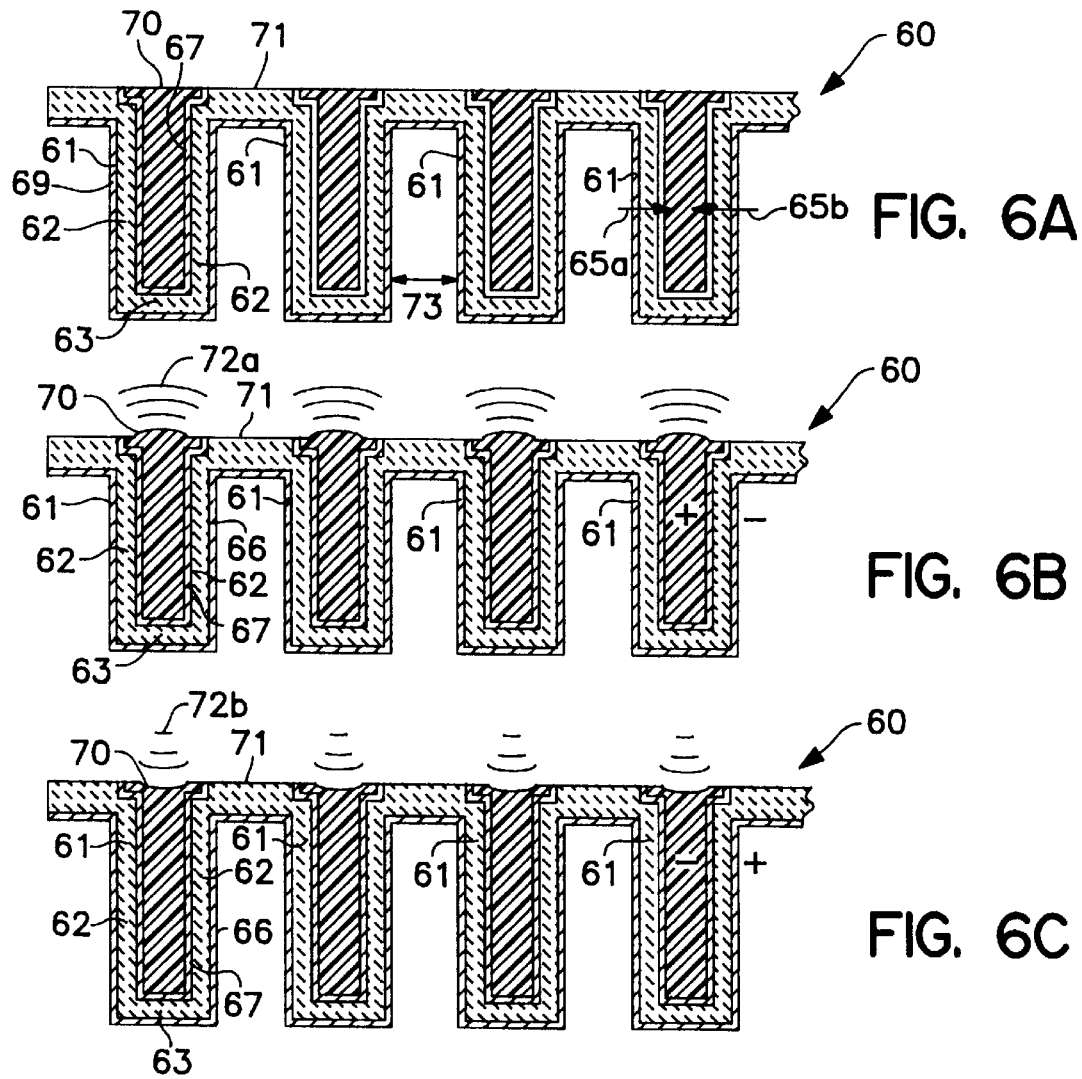

LOW VOLTAGE PIEZOELECTRIC ACTUATOR

CROSS-REFERENCE TO RELATED APPLICATIONS

The present application is a continuation-in-part of commonly assigned U.S. Ser. No. 08/847,435, filed Apr. 28, 1997, now U.S. Pat. No. 5,841,736. The present application also contains subject matter related to U.S. Pat. Nos. 5,340,510 and 5,598,050, both commonly assigned herewith. U.S. Pat. Nos. 5,841,736, 5,340,510 and 5,598,050 are incorporated herein by reference.

GOVERNMENT CONTRACT INFORMATION

The Government of the United States of America has certain rights in this invention pursuant to Contract No. N00014-95-C-0353, awarded by or for the U.S. Department of the Navy.

BACKGROUND OF THE INVENTION

The present invention relates to piezoelectric actuators. The invention particularly relates to a polymer-filled and unfilled actuators including a ceramic tube or rectangular, parallel ceramic blade pair, supported by a stiff base, and arrays of such actuators.

U.S. Pat. No. 5,340,510 discloses 1-3 and 2-2 composite actuators made up of a net-shape molded array of very fine, parallel, piezoelectric or electrostrictive ceramic elements in a polymer matrix. The elements of the 1-3 actuator are rod-shaped, while those of the 2-2 actuator are blade-shaped. The composite body is electroded on its planar upper and lower surfaces and poled to produce a composite actuator array. This composite actuator array has been a great improvement over the prior art, but further improvement is desired for low-voltage operation. The operating voltage of such an actuator array is limited by the height of the rods, which is the dimension along which the voltage is applied in operation of the array.

Particularly promising for a low-voltage actuator is a configuration substituting a ceramic tube for each rod-shaped element of U.S. Pat. No. 5,340,510. The advantages of utilizing a tube instead of a solid ceramic rod in such a actuator array are that the tube can be poled and driven by a relatively low voltage applied across the wall thickness of the tube, while a high mechanical displacement can be obtained along the tube height direction. The tube actuator can be made to operate at a very low voltage by suitably reducing the ceramic tube wall thickness, which is a great advantage in many applications. Additionally, the tube height displacement can be increased independently of the applied voltage by increasing the tube height while keeping the wall thickness constant.

Prior art piezoelectric sensors are made from ceramic tubes arranged in a periodic array. However, until the present invention, tubes have not been fabricated in an array attached to a ceramic baseplate, which can be used to facilitate electrical connection to the inner and outer tube walls for operation of the array. In the prior art, individual tubes with attached wiring have been fabricated and mounted one at a time onto a baseplate to form an array. This, however, is clearly a costly process, and it is difficult to ensure that all tubes are electrically connected properly in parallel. Also, the tubes found in the prior art are unfilled and open at both ends, a configuration unsuitable for strain amplification.

Accordingly, it is an object of the present invention to provide a piezoelectric actuator which overcomes the disadvantages of the prior art.

It is another object of the invention to provide a strain-amplified piezoelectric actuator which utilizes a polymer-filled ceramic enclosure or cavity, e.g., a tube or parallel pair of blades, with voltage across the enclosure wall thickness to produce vibration in the wall or walls which is transmitted to a desired medium by way of the polymer.

It is another object of the invention to provide a strain-amplified piezoelectric actuator device having an strain-amplified piezoelectric actuator array including a array of such polymer-filled actuators.

It is another object of the invention to provide a stiff cover plate bonded to the polymer filling the ceramic enclosure for transmitting the enclosure wall vibration to a desired medium.

It is another object of the invention to provide a piezoelectric actuator device having an array of fine ceramic tube-shaped actuators which are unfilled or filled with a soft compressible polymer, and are poled and electroded to operate in a $d_{31}$ mode, i.e., with vertical vibration of the tube walls, and including a stiff cover plate bonded to the ceramic walls of the tubes for transmitting the wall vibration to a desired medium.

SUMMARY OF THE INVENTION

In accordance with these objects, the invention is a piezoelectric actuator or transducer in which a piezoelectric or electrostrictive ceramic enclosure is open in the direction of desired transmission and has thin walls, relative to their height, on the sides normal to the open side. The enclosure walls are supported by a rigid base. The walls are poled and electroded for $d_{31}$ or $d_{15}$ operation of the actuator. The electrodes are disposed on opposite sides of the ceramic walls. If desired, the electrode on the side of the walls inside of the enclosure may extend across the base for convenient connection of the actuator to a source of electrical power. The actuator also includes a vibration transmitting means for transmitting the vibration of the enclosure walls to a desired medium.

In one type of piezoelectric actuator in accordance with the invention, the enclosure may be provided by tube walls poled to operate in a $d_{31}$ configuration or by blade-pair walls preferably poled to operate in a $d_{15}$ configuration. A compliant polymer fills and is constrained by the enclosure, leaving a single direction of free movement in the polymer. The polymer provides the vibration transmitting means, transmitting vibration of the wall to a desired medium in this single direction of free movement. In a preferred actuator, the filler material, poling and dimensions of the walls, and dimensions of the enclosure are selected to provide, on activation of the actuator, acoustic impedance matching of the actuator to the desired medium. Typically, the desired medium is a fluid, e.g., water or body fluids. Alternatively, the desired medium may be a mechanical structure of known impedance, such as a rubber mount, or a pipe or tank wall.

If desired, a cover plate may be bonded to the exposed surface of the polymer to assist in transmitting the vibration of the enclosed polymer to the desired medium. Also if desired, a two-dimensional array of such actuators may be provided.

Another type of actuator in accordance with the invention is an array of piezoelectric tubes supported by a stiff base and poled and electroded to operate in a $d_{31}$ configuration. The tubes may be unfilled or may be made more robust by filling with a soft, compressible polymer. The tube walls expand in their height direction, i.e., normally to the base of the array. The vibration transmitting means is a cover plate bonded to the tube walls to transmit the vibration of the tube walls to a desired medium.

Yet another type of device in accordance with the invention is an array of piezoelectric acoustic sensor elements extending from and interconnected by a rigid base. Each sensor element includes one or more piezoelectric ceramic walls defining an enclosure and supported by the rigid base. The enclosure is open in a direction to receive acoustic radiation. The walls are poled for operation in a $d_{15}$ or a $d_{31}$ configuration. A first electrode is bonded to the wall surfaces facing the enclosure, while a second electrode is bonded to the opposite wall surfaces. The device includes vibration transmitting means similar to those described above for transmitting the acoustic radiation, causing vibration in the walls in response to the transmitted acoustic radiation and producing an electrical signal.

BRIEF DESCRIPTION OF THE DRAWINGS

For a better understanding of the present invention, together with other objects, features, advantages, and capabilities thereof, reference is made to the following Description and appended claims, together with the Drawing in which:

FIGS. 6A–6C are schematic, cross-sectional, elevation views of an array of the actuators of FIG. 3, illustrating the transmission of the acoustic vibration of the tube walls to a selected medium by the polymer;

DETAILED DESCRIPTION OF THE PREFERRED EMBODIMENTS

Figure 1:
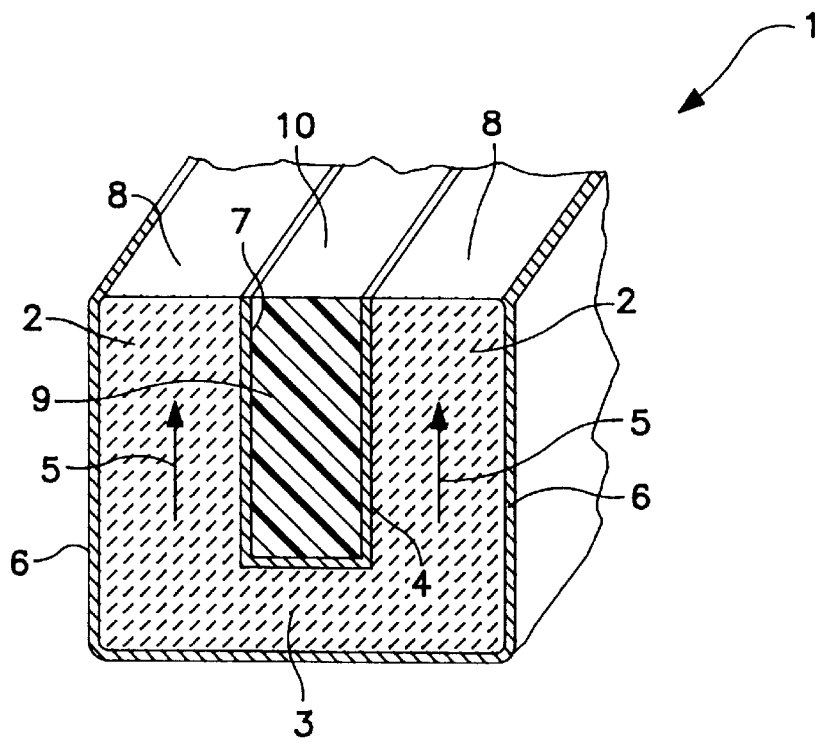
FIG. 1 is a schematic perspective view, partly in cross-section, of a portion of a strain-amplified piezoelectric composite actuator in the form of a pair of poled, electroded, rectangular ceramic blades filled with a vibration-transmitting polymer, in accordance with one embodiment of the present invention.

The piezoelectric composite actuators and devices described herein are suitable for use as low acoustic impedance, high output transmitters or area actuators. The actuators and devices may also be operated in reverse mode to provide a receive function, described in more detail below.

In one exemplary embodiment, an actuator includes a poled piezoelectric ceramic tube supported by a rigid base, conveniently but not necessarily integral with the tube. The tube and base together define a cylindrical enclosure or cavity. The inner and outer walls of the tube are separately electroded for driving the actuator across the tube wall thickness. The poling and electroding configuration of the tube provides for $d_{31}$ operation of the actuator. The tube enclosure is filled with a compliant polymer which is constrained by the tube walls and the base, leaving only a single direction of free movement for the polymer, the direction normal to the base. The polymer is selected to bond securely to the tube walls to act as a drive medium for transmitting the acoustic vibration of the walls to a desired medium. As the walls of the tube vibrate in a direction normal to the base, the increase in the wall height decreases the wall thickness, applying tensile force to the polymer filler in a direction normal to the tube wall, while the decrease in the wall height increases the wall thickness, applying compressive force to the polymer. Polymers in the stiffness range of Shore A30 to Shore D75 are greatly preferred as the filler material for filling the enclosure, since these polymers will, to some degree, maintain their volume. Thus, the polymer will contract and expand in its single direction of free movement, transmitting the acoustic vibration of the tube walls to the desired medium, providing strain amplification at low voltages.

Another exemplary embodiment is similar to the tube-shaped actuator, also providing strain amplification at low voltages. Two poled, parallel, piezoelectric ceramic blades or plates are supported by a stiff base, conveniently but not necessarily integral with the blades. The pair of blades (blade-pair) and base together define a rectangular-shaped enclosure or trough between the blades. The inner (facing) and outer (not facing) surfaces of the blades are separately electroded for driving the actuator across the blade wall thickness. The poling and electroding configuration of the blade-pair provides for $d_{15}$ operation of the actuator. The enclosure is filled with the above-described compliant polymer which bonds to the blade walls, acting as a drive medium as described above. The polymer is constrained by the blade walls and the base. If the length of the blades in a direction parallel to the base is very large relative to the distance between the blades, e. g., at least twice as large, the polymer at each end of the blade walls offers resistance to the polymer at the center portion of the actuator, effectively constraining the polymer in the center portion. Thus the polymer experiences, over most of the length of the blade walls, only a single direction of free movement, similar to that described above, in which the polymer may transmit the acoustic vibration of the blade walls to a desired medium. On activation of the actuator, the blade-pair acts as a pair of U-shaped benders in which the walls flex toward and away from each other, applying alternating compressive and tensile forces to the polymer in a direction normal to the walls. The polymer then transmits the acoustic vibration of the blade walls to the desired medium only in its single direction of free movement.

Alternatively, the ends of the enclosure formed by the blade walls and the base may be blocked, e.g., with a stiff filler material, e.g., a non-compliant polymer, or with ceramic end walls integral with the blade walls. In this embodiment, the relationship of the wall length to the wall spacing is unimportant, since the end blocks constrain the polymer at the ends of the enclosure leaving only a single direction of free movement.

In another exemplary embodiment, a low voltage piezoelectric actuator has an array of unfilled tube-shaped actuators poled and electroded to operate in a $d_{31}$ mode, i.e., with vibration of the tube walls in a direction normal to the base. A cover plate is attached to the tube walls to transmit this vibration to a desired medium. A similarly acting $d_{31}$ configured tube array filled with a shock-absorbing, soft, compressible polymer is described below.

Suitable materials for the ceramic portion of the actuators described herein include highly piezoelectric or electrostrictive ceramics including but not limited to lead zirconate titanate (PZT), lead magnesium niobate, lead zinc niobate, lead nickel niobate, or titanates, tungstates, zirconates, or niobates of lead, barium, bismuth, or strontium, or derivatives thereof. The ceramic material may be, but not necessarily is, doped with a fraction of a percent of a conventional isovalent donor and/or acceptor component to enhance its piezoelectric properties or to tailor its properties to suit the intended application. Typical dopants include iron, niobium, barium, lanthanum, and other elements. Herein, for the sake of brevity, materials of this type will be referred to as piezoelectric materials.

A shaping method such as low cost ceramic injection or compressive net-shape molding may be used to produce a tube or blade-pair blank, optionally including a rigid integral ceramic base. The piezoelectric ceramic tube-type or blade-pair-type actuator may be produced by injection molding or compression molding a ceramic green body from a mixture of a ceramic powder and a thermoplastic organic binder. The binder is removed from the blank in a conventional manner and the binder-removed blank is sintered to produce a sintered body having an array of parallel, hollow ceramic tubes or parallel blade-pairs extending upward from a ceramic base unitary with and interconnecting the tubes or blades. In the tube-type blank, the cylindrical openings through the center of the tubes may, if desired, extend through the base to the lower surface of the base. In this embodiment, the tube end opposite the base preferably is closed or capped to enclose the above-described filler polymers. For net-shape molding, the ceramic powder typically is added to the binder (or carrier) at a high solids loading, e.g., greater than 50 volume %.

The binder is selected to provide with the powder a hot thermoplastic mixture suitable for injection or compression molding, and to be removed by slow heating with no residue deleterious to the fabrication process or the piezoelectric properties of the ceramic. Examples of suitable binders include waxes, such as paraffin wax, and thermoplastics such as polyethylene or polypropylene. The mixture may be cooled and granulated before molding.

The blank may be molded by injection molding of the hot ceramic-binder mixture into a cooler, closed mold, the mold being cooled to a temperature sufficient to solidify the mixture. The mold halves, or inserts therein, together are the negative of the desired tube array blank. The blank is then ejected from the mold. This method is similar to that described in U.S. Pat. No. 5,340,510, incorporated herein by reference.

Alternatively, the blank may be compression molded by forming a green ceramic preform shaped from the above-described hot ceramic-binder mixture, and placing the preform between upper and lower mold halves of a heated compression molding apparatus. The molding temperature should be slightly higher than the softening temperature of the ceramic-binder mixture. The mold halves, or inserts therein, together are the negative of the desired tube or blade-pair array blank. The heated mold halves are brought together with pressure sufficient to deform the preform at the selected mold temperature, forcing protrusions on the mold halves to penetrate the preform. The displaced material of the preform flows into the mold cavity between the protrusions, forming a green ceramic blank having the desired shape of an array of tubes or blade-pairs on a supporting base. After cooling, the molded blank is removed from the mold.

In either method, the binder is nondestructively removed from the molded blank by slow binder removal over a period of 1–100 hours. Nondestructive binder removal is aided by the high solids loading in the mixture. Once the binder is removed, the ceramic body is fired, i.e., sintered to achieve a fully dense (at least 93% of theoretical density) ceramic body, and poled using conventional techniques.

The sintered body is electroded at least outside and inside the tube walls by applying an electrically conductive coating on all surfaces of the sintered body, then separating the electrodes by removing a portion of the coating or, alternatively, by masking the area over which the electrodes are to be separated before the coating is applied. The coating is preferably applied by sputtering, chemical or physical vapor deposition, electroless plating, or dipping in a conductive solution, all of which processes are well known in the art. The electroding is described in more detail below. In the preferred embodiments, however, each electrode outside the enclosure walls is electrically isolated from a surface or surfaces of the actuator used for simple and cost effective connection of the electrode(s) inside the enclosure walls to a source of electrical power.

Suitable conductive materials for the electrodes include but are not limited to metals such as silver, palladium, or platinum, nickel, electroless nickel, vapor deposited or sputtered gold, chrome-gold, alloys of these metals, and conductive polymers or glasses.

The compliant filler polymer described above is selected to bond to the ceramic walls and to be sufficiently compliant to move in response to the compressive and tensile forces applied by the vibrating ceramic walls. It has been found that compliant polymers exhibiting stiffness in the range of Shore A 30 to Shore D 75 are most effective as filler materials to transmit the vibration of the ceramic walls to a desired medium. Polymers stiffer than Shore D 75 are not sufficiently responsive to wall vibration, while polymers less stiff than Shore A 30 do not sufficiently support actuation. The most preferred stiffness range for maximum actuator performance is Shore A 65 to Shore D 65. The polymers may be thermoplastic or thermosetting. Suitable polymers in these stiffness ranges include but are not limited to solid and filled polyurethanes, natural and synthetic rubbers, silicones, epoxy compounds, and polyethylenes. Especially useful for modifying the stiffness of various polymers is the known technique of including voids or particulates in the microstructure of the compliant filler polymer, e.g., by incorporating minute hollow polymeric spheres or metal or ceramic powders into the polymer before filling.

In one embodiment of an actuator having an array of $d_{31}$ poled and electroded tubes, the tubes are unfilled or may be filled with a shock-absorbing, soft, compressible polymer, e.g., a soft polyurethane or rubber, which may also fill the troughs between the tubes. A cover plate is bonded to the upper ends of the tube walls. The compressible polymer is selected to absorb shock without interfering with actuator function, thus differing from the compliant, vibration-transmitting polymer described above. The compressible polymer may include voids or be filled with gas-filled microballoons to increase compressibility and the mechanical shock-absorbing capabilities of the polymer.

Configurations other than the tube enclosures and the blade pair enclosures described herein are possible and are within the scope of this invention. For example hollow spheres or non-parallel blades could be used.

The description below of various illustrative embodiments shown in the Drawings is not intended to limit the scope of the present invention, but merely to be illustrative and representative thereof.

Referring now to FIG. 1, actuator 1 in accordance with one embodiment includes an associated pair of parallel rectangular walls 2 connected by rigid base 3 to define enclosure or trough 4. Base 3 preferably is ceramic, and most preferably is ceramic co-molded with walls 2 to be unitary therewith. Alternatively, walls 2 may be bonded to base 3 by conventional means, base 3 being ceramic or other rigid material which will permit the flexing of the walls as described below.

Walls 2 are poled and electroded in a $d_{15}$ configuration, as shown at arrows 5. Walls 2 and, optionally, base 3 are coated with an electrically conductive coating to provide outer electrode 6 and inner electrode 7, which are electrically isolated from one another at upper surfaces 8 of walls 2. Enclosure 4 is filled with compliant polymer 9, which bonds to walls 2. Polymer 9 provides unconstrained surface 10 which, on activation of actuator 1, generates vibration or acoustic radiation in the manner described above.

Figure 2:
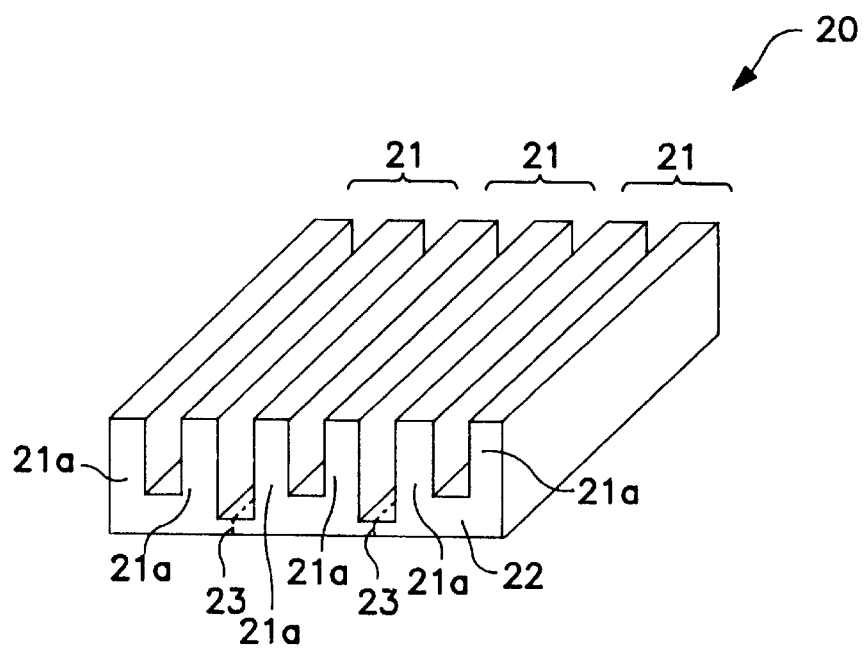
FIG. 2 is a schematic perspective view of a net-shape molded piezoelectric ceramic body for fabricating an actuator of FIG. 1, or for fabricating an array of such actuators in accordance with another embodiment of the invention.

The piezoelectric ceramic blade pair actuator shown in FIG. 1 may by produced from ceramic blank 20 of FIG. 2. Blank 20 is produced by a known method, e.g., net shape injection or compression molding of a 2-2 configuration ceramic green body from a mixture of a ceramic powder and a thermoplastic organic binder, as described above and in above-referenced U.S. Pat. No. 5,340,510. The binder is removed from the blank as described in the patent and the binder-removed blank is sintered to produce sintered blank 20 having, e.g., an array of parallel ceramic blade-pairs 21 extending upward from ceramic base 22 unitary with and interconnecting all of blades 21a. Although the ceramic body may prepared by conventional means such as dicing, etching, laser machining, etc., net-shape molding methods are greatly preferred because of the lower manufacturing costs achievable by these methods.

The ceramic body is poled by conventional techniques and each blade pair 21 is electroded (e.g., by sputtering, chemical or physical metal vapor deposition, electroless plating, dipping in a conductive solution, or other known conductive material deposition technique), as shown in FIG. 1. The enclosures bounded by the blade pairs are then filled with the filler polymer as shown in FIG. 1. The prepared, filled blank may then, if desired, be separated into individual blade pair actuators by conventional ceramic cutting techniques, e.g., by dicing between blade pairs, as shown by dashed lines 23 of FIG. 2. Alternatively, a single blade pair (optionally with integral base) may be formed separately and an actuator fabricated therefrom using similar techniques. Preferably, however, the blank would be used to fabricate a device including an array of blade pairs on a common base, as described further below.

Figure 3A:
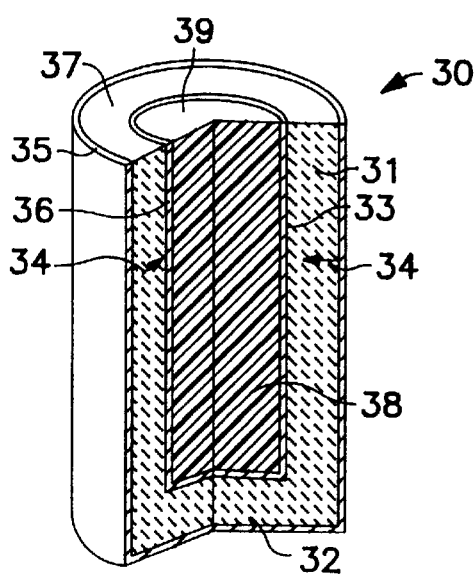
FIG. 3A is a schematic perspective view, partly in cross-section, of a strain-amplified piezoelectric composite actuator in the form of a poled, electroded ceramic tube filled with a vibration-transmitting polymer, in accordance with another embodiment of the invention.

Referring now to FIG. 3A, actuator 30 in accordance with another embodiment includes ceramic tube wall 31 connected by rigid base 32 to define cylindrical enclosure or cavity 33. Base 32 may be ceramic, and may be co-molded with wall 31 to be unitary therewith. Alternatively, wall 31 may be bonded to base 32 by conventional means, base 32 being ceramic or other rigid material which will permit the flexing of the tube wall as described below.

Wall 31 is poled, as shown at arrows 34, and electroded to operate in a $d_{31}$ configuration. Wall 31 and, optionally, base 32 are coated with an electrically conductive coating to provide outer electrode 35 and inner electrode 36, which are electrically isolated from one another at upper surface 37 of wall 31. Enclosure 33 is filled with compliant polymer 38, which bonds to wall 31. Polymer 38 provides unconstrained surface 39 which, on activation of actuator 30, generates acoustic radiation in the manner described above.

Figure 3B:
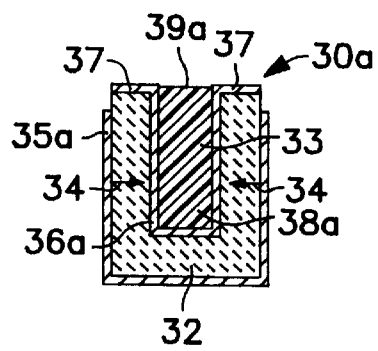
FIGS. 3B and 3C are schematic cross-sectional elevation views of strain-amplified piezoelectric composite actuators in the form of poled, electroded ceramic tubes filled with vibration-transmitting polymer, in accordance with other embodiments of the invention.
Figure 3C:
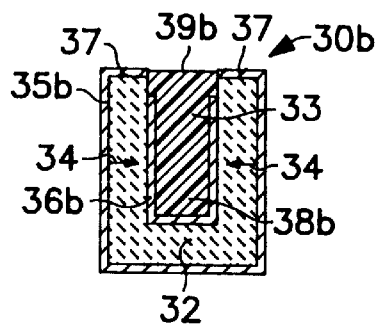

Alternative actuators similar to the actuator shown in FIG. 3A are shown in FIGS. 3B and 3C. Similar features to those shown in FIG. 3A are indicated by the same reference numerals. Actuators 30a and 30b differ from actuator 30 in that outer electrode 35a or 35b, respectively, and inner electrode 36a or 36b, respectively, are electrically isolated form one another at the sides of tube wall 31. As shown in FIG. 3B, electrode 36a extends over upper surface 37, and gap 37a isolates electrode 36a from electrode 35a. Similarly, as shown in FIG. 3C, electrode 35b extends over upper surface 37, and gap 37b isolates electrode 35b from electrode 36b. Although FIGS. 3B and 3C show alternate electrode configurations for tube-type actuators, similar electrode configurations may be provided for blade-pair actuators similar to actuator 1 shown in FIG. 1.

Figure 4:
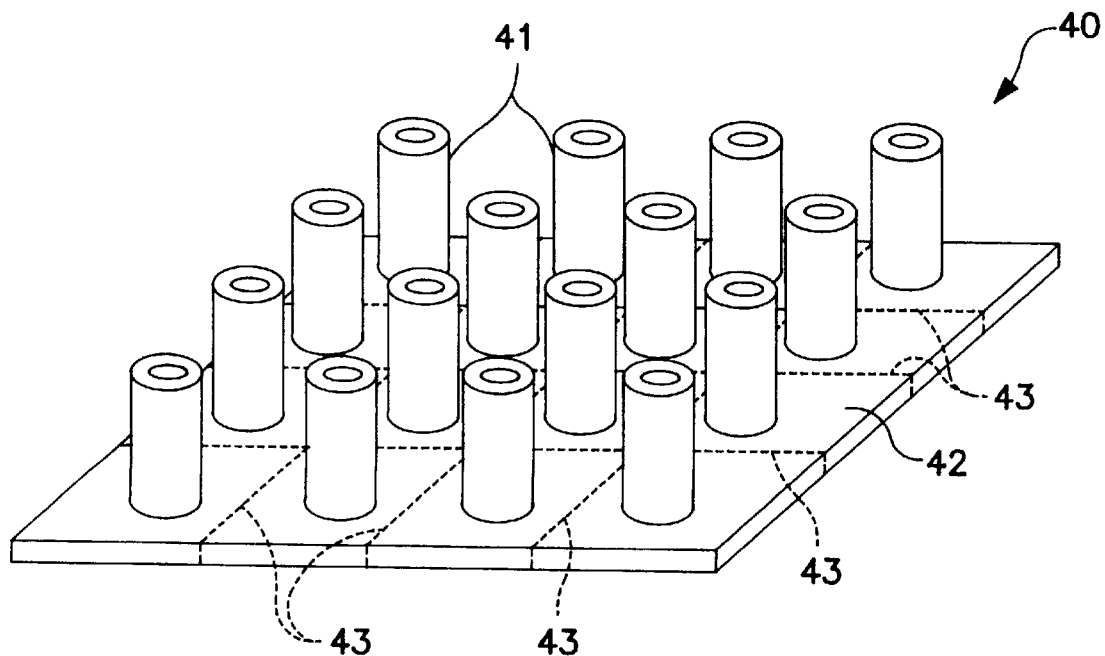
FIG. 4 is a schematic perspective view of a net-shape molded piezoelectric ceramic body for fabricating the actuator of FIG. 1, or for fabricating an array of such actuators in accordance with another embodiment of the invention.

Each of the piezoelectric ceramic tube actuators shown in FIGS. 3A–3C may by produced from ceramic blank 40 of FIG. 4. Blank 40 is produced by a known method, e.g., net shape injection or compression molding of a ceramic green body from a mixture of a ceramic powder and a thermoplastic organic binder, as described in above-referenced application Ser. No. 08/847,435 and U.S. Pat. No. 5,340, 510. The binder is removed from the blank as described in the application and patent and the binder-removed blank is sintered to produce sintered blank 40 having, e.g., an array of parallel ceramic tubes 41 extending upward from ceramic base 42 unitary with and interconnecting all of tubes 41.

The ceramic body is poled using conventional techniques and each tube 41 is electroded as shown in FIG. 3A in the manner described above. The cylindrical enclosures are then filled with the compliant filler polymer as shown in FIG. 3A, producing cylindrical columns of filler material. The prepared, filled blank may then, if desired, be separated into individual tube actuators by conventional ceramic cutting techniques by dicing between tubes, as shown by dashed lines 43 of FIG. 4. Alternatively, a single tube (optionally with integral base) may be formed separately and an actuator fabricated therefrom using similar techniques. Preferably, however, the blank would be used to fabricate a device including an array of tube actuators on a common base, as described further below.

The ceramic body shown in FIG. 4 has 16 tubes in the array, and may be, e.g., 50×50 mm square but larger or smaller ceramic bodies are within the invention, e.g., bodies 10–100 mm on a side and having 1×10,000 tubes. The tubes typically are 0.5–10 mm in outside diameter, 1–100 mm in height, and spaced apart by 0.5–10 mm. The ceramic body shown in FIG. 2 has three blade-pairs for illustration. However, a typical blade-pair array ceramic body may be similar in size to the tube array body described above, and typically has 1–1000 blade pairs. The blade-pairs of each actuator element in an array typically are spaced 0.05–20 mm apart with enclosures 0.1–10 wide bounded by the blade-pairs. A typical height for each blade is 1–100 mm. For low voltage operation, the wall thickness of the tubes or blades should be, e.g., 0.1–5 mm thick. Preferably, the tubes or blades are poled to operate in $d_{31}$ and $d_{15}$ configurations, respectively.

The sintered body is electroded on at least the outside and inside tube walls by applying an electrically conductive coating on all surfaces of the sintered body, then separating the electrodes by removing a portion of the coating or, alternatively, by masking the area over which the electrodes are to be separated before the coating is applied. The conductive coating may be any suitable material known in the art, e.g., any of the materials described above. The coating is preferably applied by sputtering, chemical or physical vapor deposition, electroless plating, or dipping, all of which processes are well known in the art.

In some embodiments, a cover plate is bonded to the upper surface or surfaces of the polymer filler material to assist in transmitting the vibration of the walls of the actuator to a desired medium. The electroding and cover plate are described in more detail below.

Figure 5A:
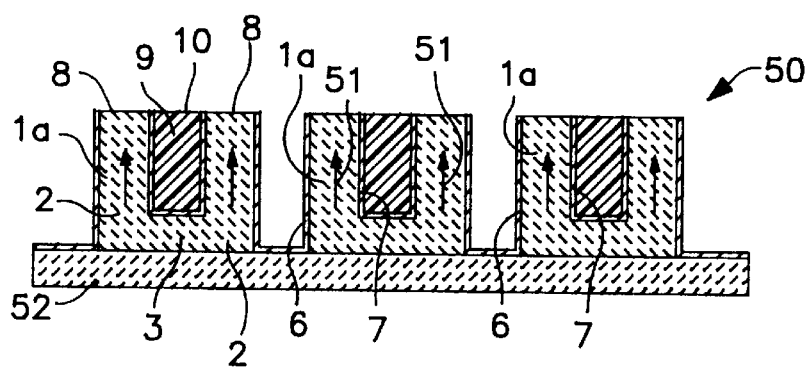
FIGS. 5A–5C are schematic, cross-sectional, elevation views of an array of the actuators of FIG. 1, illustrating the transmission of the acoustic vibration of the blade walls to a selected medium by the polymer.
Figure 5B:
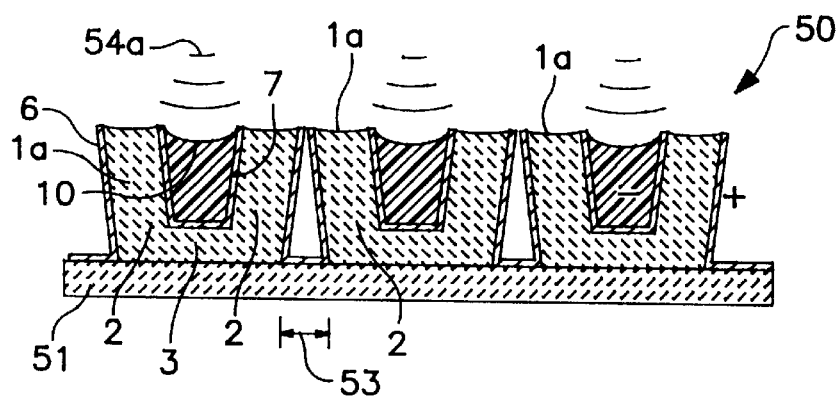
Figure 5C:
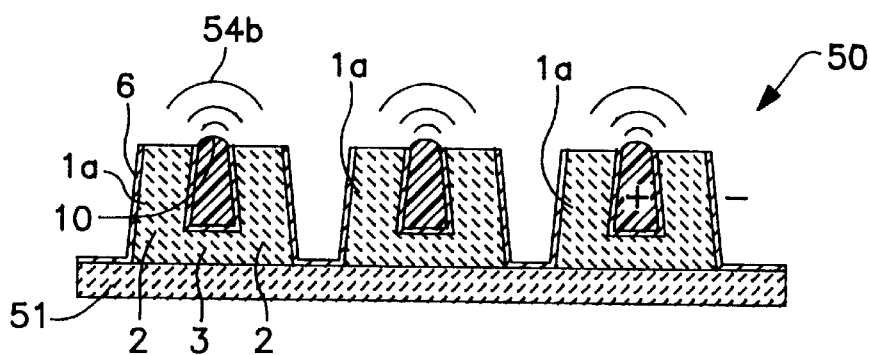

FIGS. 5A–5C are schematic illustrations of a device including an array of actuator elements similar to that shown in FIG. 1, illustrating the transmission of the vibration of the blade-pair walls to a desired medium by the polymer. Features similar to those shown in FIGS. 1 and 2 are indicated by the same reference numerals. Device 50 is poled to operate in a $d_{15}$ configuration, as shown by arrows 51. Individual actuators 1a, each including walls 2 and base 3, are mounted on substrate 52. Alternatively, actuators 1a may share a common base which may be integral therewith. Actuators 1a are interconnected by substrate 52 and are spaced apart from one another by troughs of width 53 which is selected to permit free movement of walls 2. Electrodes 6 and 7 are provided by an electrically conductive coating, e.g., of a metal, bonded to outer and inner surfaces, respectively, of walls 2. On activation of device 50, walls 2 bend alternately away from and toward one another, as shown in FIGS. 5B and 5C, exerting alternating tensile and compressive forces, respectively, on polymer filler material 9 and creating acoustic waves 54a and 54b, respectively, at surfaces 10 of filler material 9 affecting a medium, e.g., water, surrounding actuators 1a. Alternatively, a blade-pair device similar to device 50 may be poled to operate in a $d_{31}$ configuration, similarly to the device shown in FIGS. 6A–6C.

FIGS. 6A–6C are schematic illustrations of a device including a two-dimensional array of actuator elements similar to those shown in FIG. 3A and poled to operate in a $d_{31}$ mode, illustrating the transmission of the vibration of the blade walls to a desired medium by the polymer. Features similar to those shown in FIG. 3A are indicated by the same reference numerals. The term "two dimensional," as used herein, is intended to mean an array having rows of at least two elements per row in two dimensions, but being only one element deep in the third dimension. Device 60 includes individual actuators 61, each including walls 62 and cap 63 defining enclosure or cavity 64. The actuators are poled to operate in a $d_{31}$ configuration, as shown by arrows 65a and 65b. Electrodes 66 and 67 are coatings of, e.g., metal bonded to the outer and inner surfaces, respectively, of walls 62. Polymer filler material 69 fills each enclosure 64 with surface 70 of the polymer exposed in the desired direction of acoustic radiation. Actuators 61 are supported and interconnected by base 71 and are spaced apart from one another by troughs of width 73 which is selected to permit free movement of walls 62. Alternatively, bases 3 of actuators 30 as illustrated in FIG. 3A may be mounted on a substrate in a manner similar to that for actuators 1a of FIGS. 5A–5C. On activation of device 60, walls 62 of each element vibrate in a direction normal to the base. The decrease in the wall height increases the wall thickness, as shown in FIG. 6B, applying tensile force to the polymer filler in a direction normal to the tube wall. The increase in the wall height decreases the wall thickness, as shown in FIG. 6C. The increasing and decreasing wall thickness applies alternating compressive and tensile forces to polymer filler 9 in a direction normal to tube walls 62. Additionally, in the embodiment shown in FIGS. 6A–6C, the vibration in the tube walls results in further compressive and tensile forces applied to the compliant filler polymer 9 by bases 63 as walls 62 decrease and increase in height. The alternating tensile and compressive forces applied to polymer 9 create acoustic waves 53a and 53b, respectively, at surfaces 70 of filler material 69 affecting a medium, e.g., water, surrounding surfaces 70.

Figure 7:
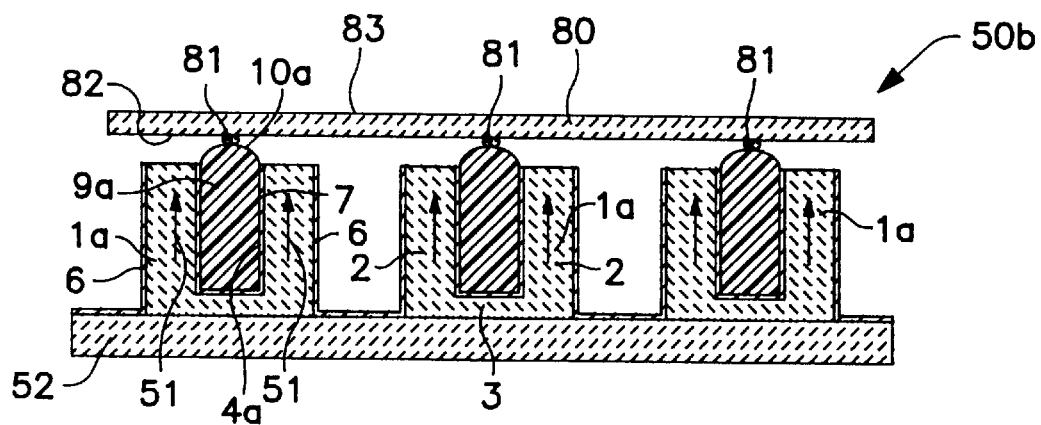
FIG. 7 is a schematic elevation view of an actuator array similar to that shown in FIG. 5A with a cover plate bonded to the polymer for transmission of the vibration of the polymer to the desired medium.

FIG. 7 illustrates an actuator array similar to that shown in FIGS. 5A–5C with a cover plate bonded to the compliant polymer filler material for transmission of the vibration of the polymer filler to the desired medium. Features similar to those shown in FIGS. 5A–5C are indicated by the same reference numerals. Device 50b is poled to operate in a $d_{15}$ configuration, as shown by arrows 51. Individual actuators 1a, each including walls 2 and base 3, are mounted on substrate 52. Enclosure or cavity 4a is slightly overfilled with polymer filler material 9a, resulting in a slight mounding up of filler material surface 10a (exaggerated for illustration purposes). Cover plate 80 is bonded to filler material 9a at points 81 on surfaces 10a, and includes inner surface 82 and outer surface 83. Cover plate 80 is fabricated from a stiff, non-conductive material or a stiff electrically conductive material with an electrically insulating, e.g., polymeric, layer covering surface 82 to insulate actuator elements 1a from the conductive material. Alternatively, if the actuator elements are electroded in a manner similar to that shown in FIG. 3A or FIG. 3B, as described above, the cover plate, filler material, and any bonding material therebetween may be electrically conductive, the cover plate thereby being suitable for use as an electrical connection for inside electrodes 7. On activation of device 50b, walls 2 bend alternately away from and toward one another, as shown in FIGS. 5B and 5C, exerting alternating tensile and compressive forces, respectively, on polymer filler material 9a and causing surfaces 10a to vibrate inward and outward, respectively, relative to enclosure 4a. Cover plate 80, bonded to surfaces 10a, vibrates with surfaces 10a creating an acoustic wave at outer surface 83, affecting a medium, e.g., water, at surface 83.

Figure 8:
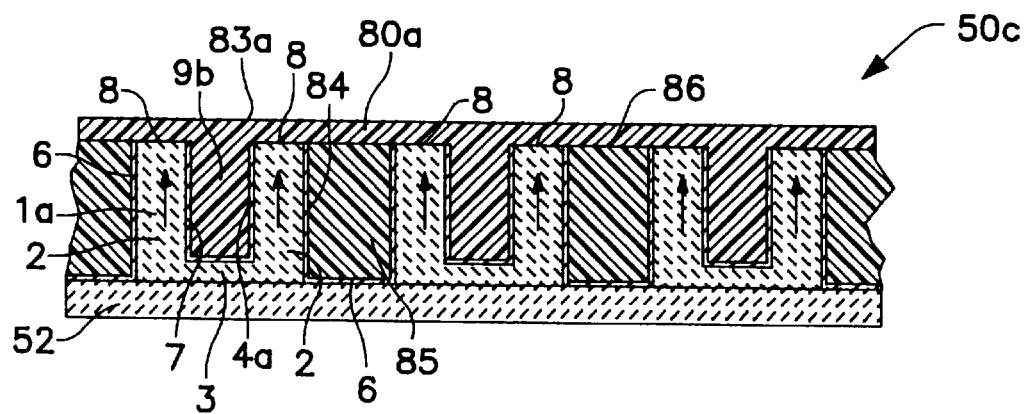
FIG. 8 is a schematic elevation view of an actuator array similar to that shown in FIG. 7, in which the polymer itself acts as a cover plate.

FIG. 8 illustrates an actuator array similar to that shown in FIG. 7, but in which the compliant filler polymer itself acts as a cover plate. Features similar to those shown in FIG. 7 are indicated with the same reference numerals. Device 50c is poled to operate in a $d_{15}$ configuration, as shown by arrows 51. Individual actuators 1a, each including walls 2 and base 3, are mounted on substrate 52. Enclosure or cavity 4a is overfilled with polymer filler material 9b to flow over upper surfaces 8 of walls 2, forming integral polymeric cover plate 80a having outer surface 83a. Preferably, troughs 84 between individual actuator elements 1a are filled with soft, compressible polymer 85 before filling the enclosures with the compliant filler material. Such prefilling of the troughs between elements makes it possible to completely cover all upper surfaces 8 with a single, unitary cover plate, as polymer overflowing each enclosure flows over the compressible polymer and melds with polymer overflowing surrounding enclosures. Compressible polymer 85 preferably is selected to be loosely bonded to walls 2.

On activation of device 50c, walls 2 bend alternately away from and toward one another, as shown in FIGS. 5B and 5C, exerting alternating tensile and compressive forces, respectively, on polymer filler material 9b and causing integral cover plate 80a to vibrate. The vibration of integral cover plate 80a creates an acoustic wave at outer surface 83a of the cover plate, affecting a medium, e.g., water, at surface 83a. A similar cover plate may be bonded to the compliant polymer filler in a device including an array of tube-type actuators similar to that shown in FIGS. 6A–6C. Alternatively, the electrodes may be similar to those shown in FIGS. 3B or 3C, as described above, and the compliant polymer filler providing the cover plate is selected to be electrically conductive. In this configuration, the polymer filler material providing the cover plate may be used as an electrical connection for inside electrodes 7.

The devices illustrated in FIGS. 7 and 8 include blade-pair-type actuator elements poled to operate in a $d_{15}$ configuration. However, the concepts of the cover plate and integral filler material-cover plate combination may also be applied to similar devices including tube-type actuator elements configured to operate in a $d_{31}$ mode, for example, the device shown in FIGS. 6A–6C and similar devices in which the tube-type elements are electroded as shown in FIGS. 3B and 3C.

The embodiments described above are activated with alternating currents (ac mode), causing alternating tensile and compressive forces to be exerted on the filler material. However, any of the embodiments described herein may be operated using a pulsed direct current (dc mode), exerting either tensile or compressive forces to be exerted intermittently, with relaxation of the polymer between voltage pulses.

Figure 9:
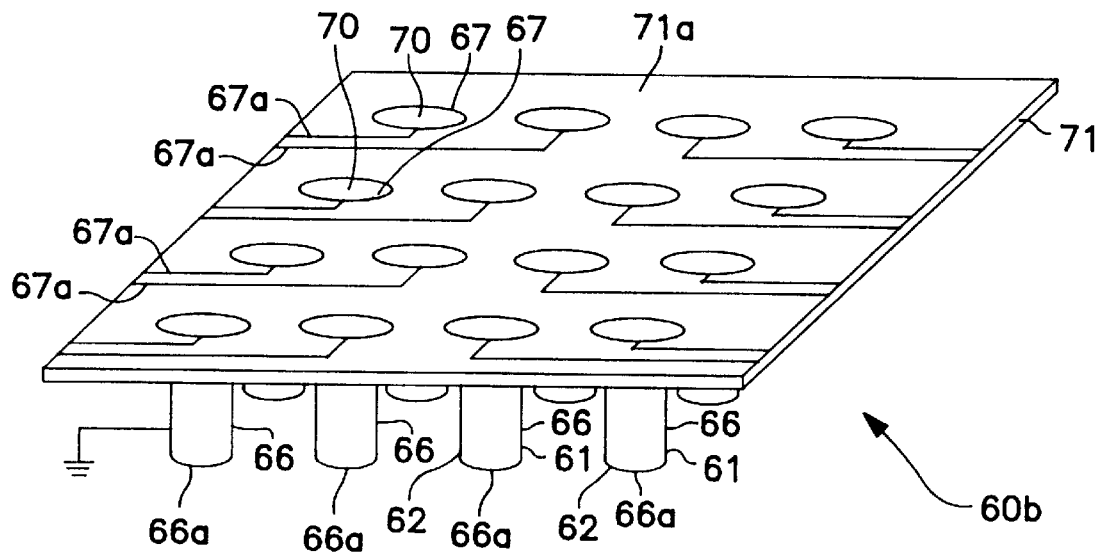
FIG. 9 is a schematic perspective view of an actuator array similar to that shown in FIG. 6A, showing an electroded base with portions of a conductive coating removed to isolate the electrodes and circuitry of the actuators from one another, in accordance with another embodiment of the invention.

FIG. 9 illustrates an actuator array similar to that shown in FIGS. 6A–6C, showing an electroded base with portions of a conductive coating removed to isolate the electrodes and circuitry of the actuators from one another. Features similar to those shown in FIGS. 6A–6C are indicated by the same reference numerals. Device 60b includes individual tube-type actuators 61 poled to operate in a $d_{31}$ configuration and mounted on common base 71 having lower surface 71a. (The device is shown inverted relative to that illustrated in FIGS. 6A–6C for clarity.) Outer electrodes 66 coat outer surfaces of walls 62, while inner electrodes 67 coat inner surfaces of the walls. A compliant polymer filler material fills each enclosure with surface 70 of the polymer exposed in the desired direction of acoustic radiation. Preferably, actuator elements 66 are capped or molded with closed ends at ends 66a to further constrain the compliant filler polymer. Actuators 61 are supported and interconnected by base 71 including base lower surface 71a. Base lower surface 71a was completely coated with a conductive material, e.g., in the same coating operation by which inner electrodes 67 were deposited. Portions of the conductive coating have been removed, creating connector portions 67a and isolating inner electrodes 67 and connector portions 67a of individual actuator elements 61 from one another. Alternatively, portions of lower surface 71a may be masked during the coating operation, or other conventional means may be employed to fabricate individual connector portions 67a. Individual connector portions 67a may be used to activate individual actuator elements 61 independently of one another in device 60b.

Figure 10A:
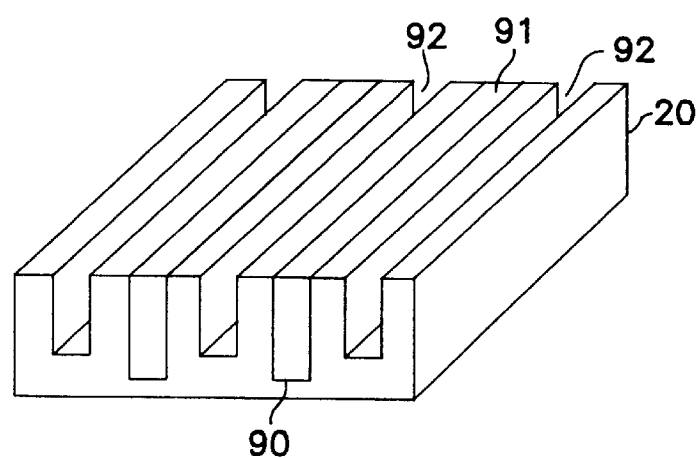
FIGS. 10A–10G are schematic perspective views of steps in the fabrication of an actuator array device in accordance with still another embodiment of the invention.

FIGS. 10A–10G illustrate steps in the fabrication of one embodiment of a blade-pair type actuator array device in which the compliant polymer filler is constrained from expanding along the length of the enclosures, allowing only a single direction of free movement for the compliant filler material in the enclosures. FIG. 10A shows ceramic body 20, similar to that shown in FIG. 2, poled and electroded in a configuration similar to the device of FIG. 5A, and with troughs 90 between blades 21a filled with soluble material 91, e.g., a wax or water soluble resin. Alternate troughs 92 between blades are unfilled.

Figure 10B:
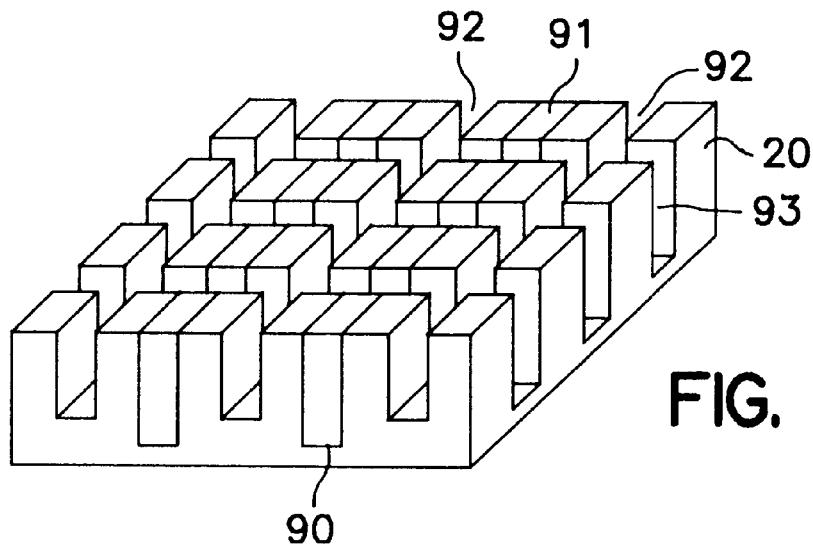
Figure 10C:
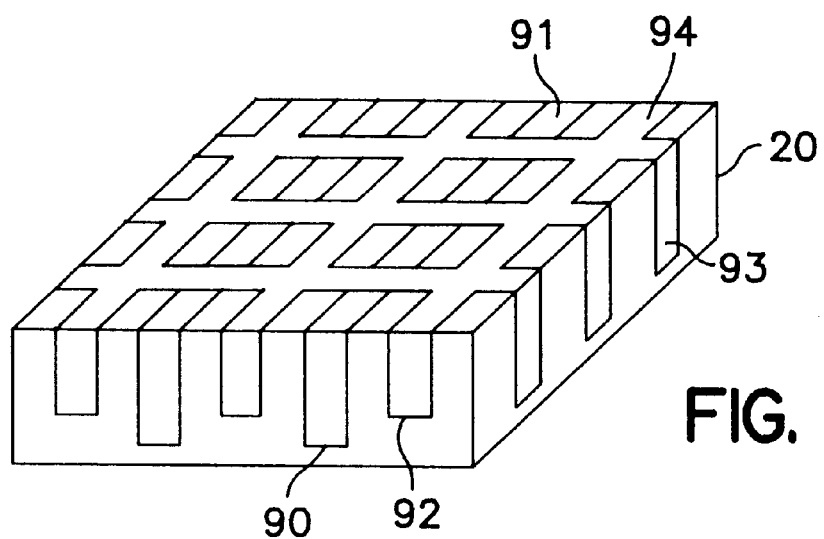
Figure 10D:
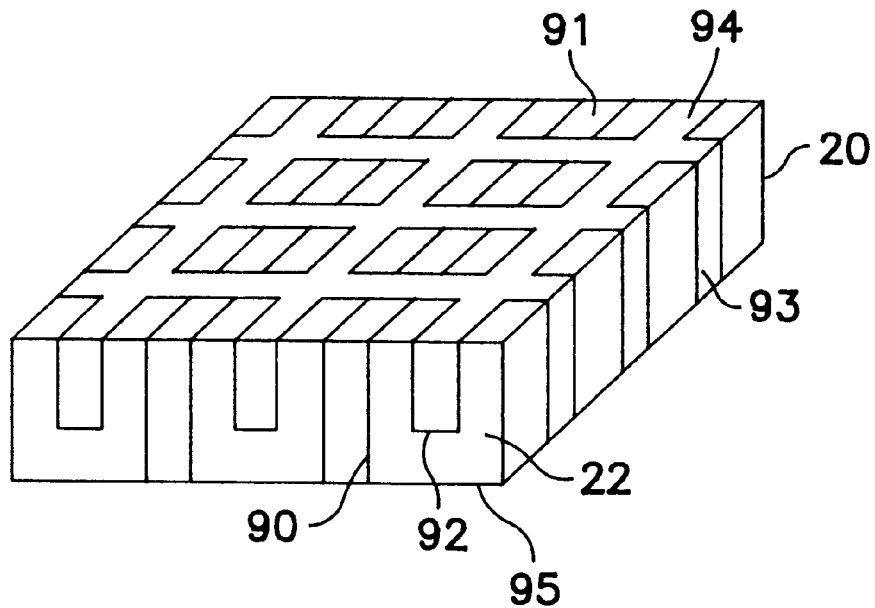
Figure 10E:
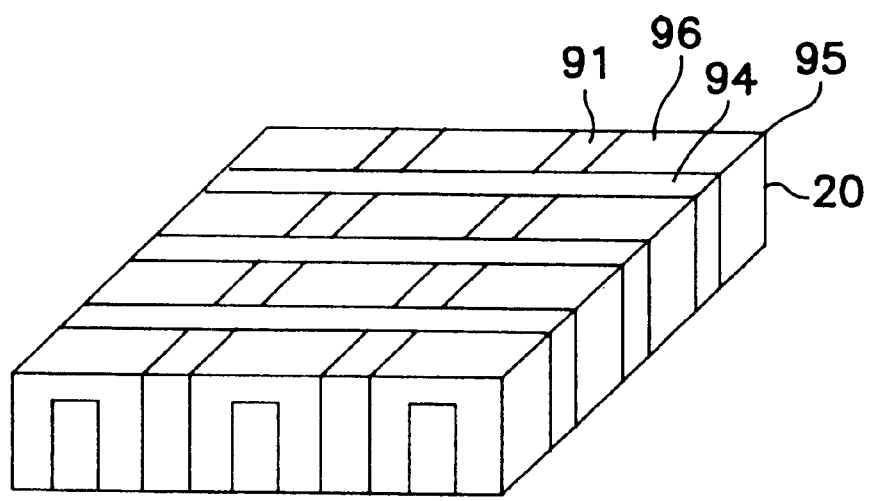

FIG. 10B shows body 20 diced to form secondary troughs 93 normal to troughs 90 and 92. Secondary troughs 93 and troughs 92 are filled with an electrically insulating, compliant filler polymer material 94, as described above, e.g., a polyurethane, as shown in FIG. 10C. As shown in FIG. 10D, a portion of base 22 is removed to expose soluble filler 91 and the portion of compliant filler polymer 94 filling secondary troughs 93 at surface 95 of base 22. FIG. 10E shows body 20 inverted, illustrating electrically conductive electrical contacts 96 applied to the exposed ceramic at base surface 95. Contacts 96 are in electrical communication with the electrodes coating the inner surface of trough 92, which acts as the enclosure described above for compliant filler polymer 94 acted upon by the blade pair elements in the completed device.

Figure 10F:
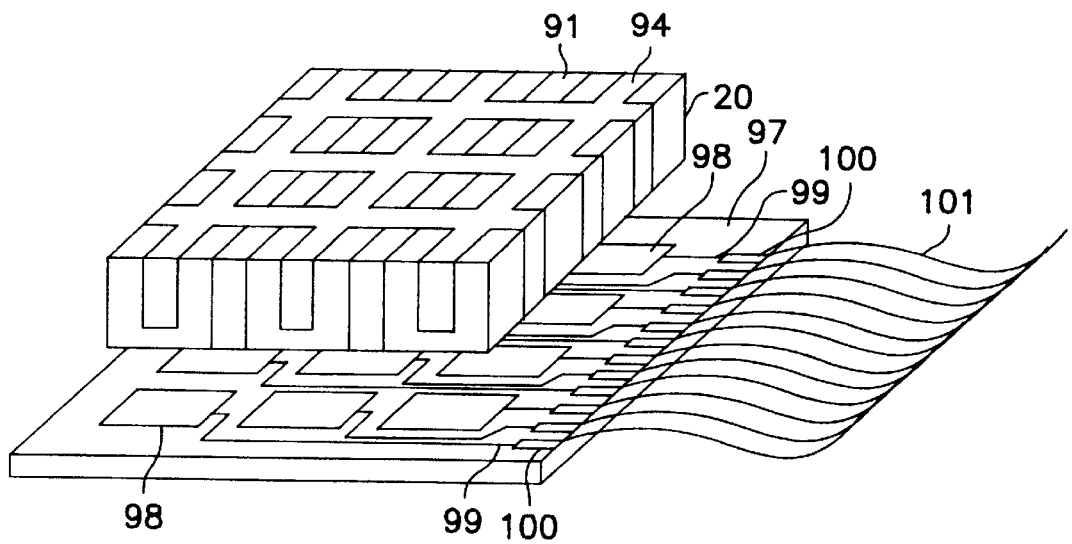
Figure 10G:
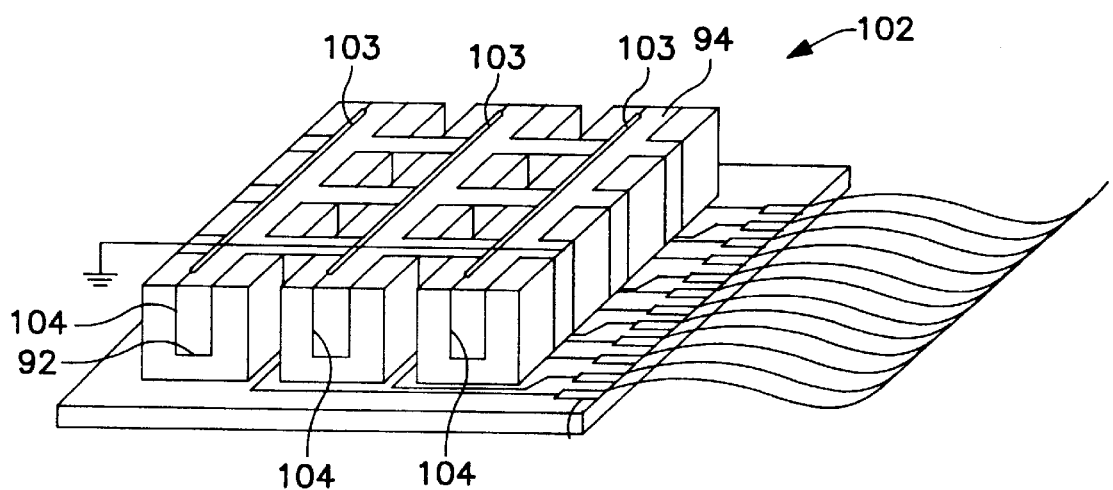

Electroded, filled body 20 is then bonded to circuit board 97, as shown in FIG. 10F, in which body 20 is shown again inverted to its original position. Circuit board 97 is patterned with electrical contacts 98, patterned to mate to contacts 96, and with connector circuitry 99 and electrical edge contacts 100 for connection of the device to a source of electrical power (not shown) via wiring harness 101. FIG. 10G shows the completed piezoelectric actuator device 102, in which soluble filler material 91 has been removed from troughs 90 and bus bars 103 are applied to electrically interconnect with inner electrodes 104 in enclosures (troughs) 92 for grounding of device 102.

Figure 11:
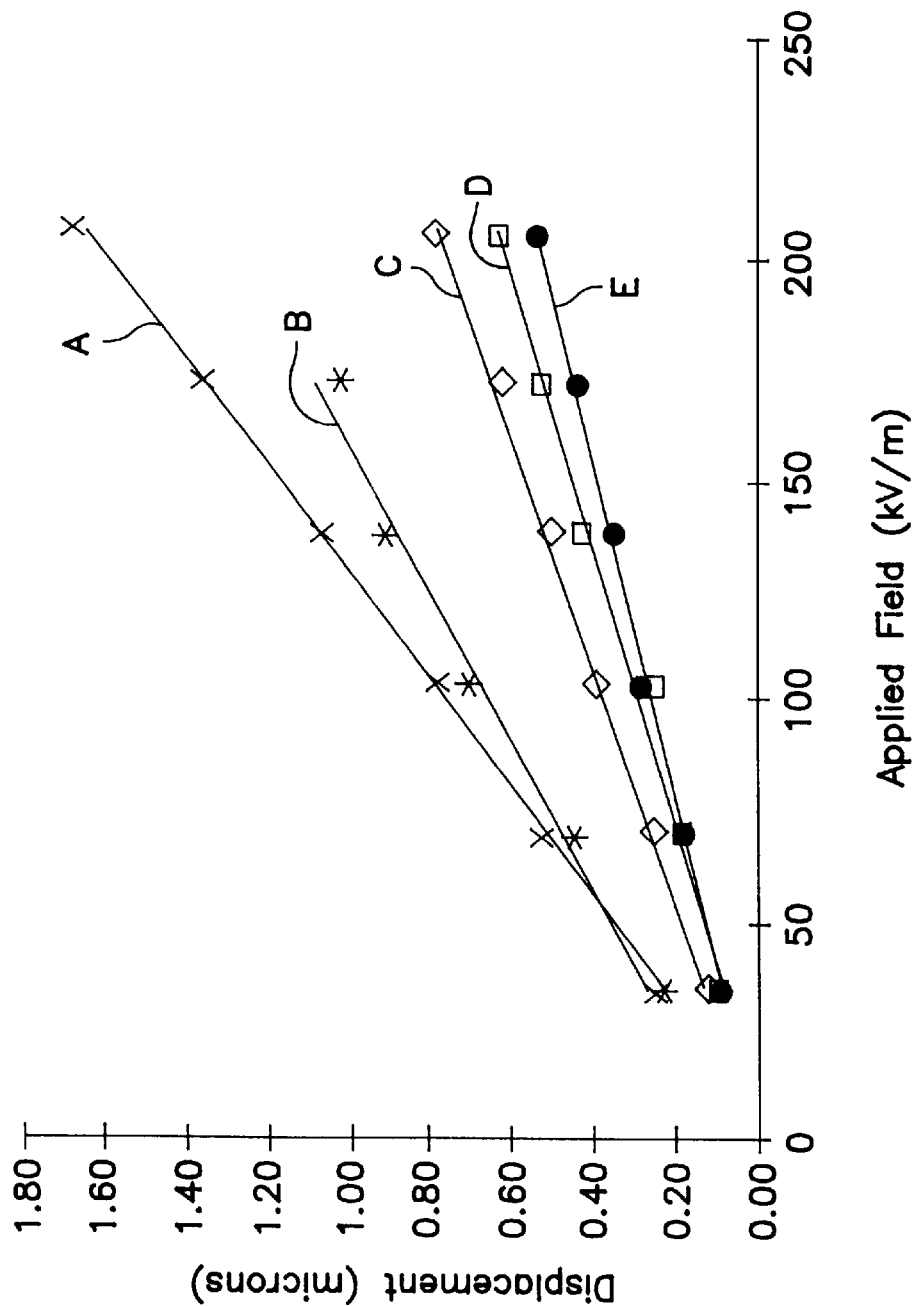
FIG. 11 is a graph illustrating the relative polymer displacements at various electric field strengths for different polymers used as fillers for one actuator in accordance with the invention.

Displacements were measured for actuator devices including a single row of approximately 10 tube-type actuators, each similar to that shown in FIG. 3A. Each tube actuator element had a 3 mm diameter tube outside diameter, 0.6 mm wall thickness, and 10 mm height. Electroless nickel was plated onto the ceramic to form the electrodes, and the enclosures were filled with polymers of various compliance values. FIG. 11 is a graph illustrating the average relative polymer displacements at various electric field strengths for the different filler polymers. As shown in FIG. 11, a solid Shore D65 flexible polyurethane filler material, line A, gave the greatest displacement. A solid Shore A65 polyurethane material, line B, also gave excellent displacement results, while a voided Shore D65 polyurethane material, line C, resulted in displacements between that of the Shore A65 polyurethane and that of an unfilled hollow tube, line D. A mathematical model of an unfilled tube was calculated, giving the results shown by line E. A soft, silicone rubber filler material was also tested, giving results approximately equal to those of an unfilled tube. FIG. 11 clearly illustrates that the displacement of the devices described herein may be tailored to suit a variety of applications.

Figure 12:
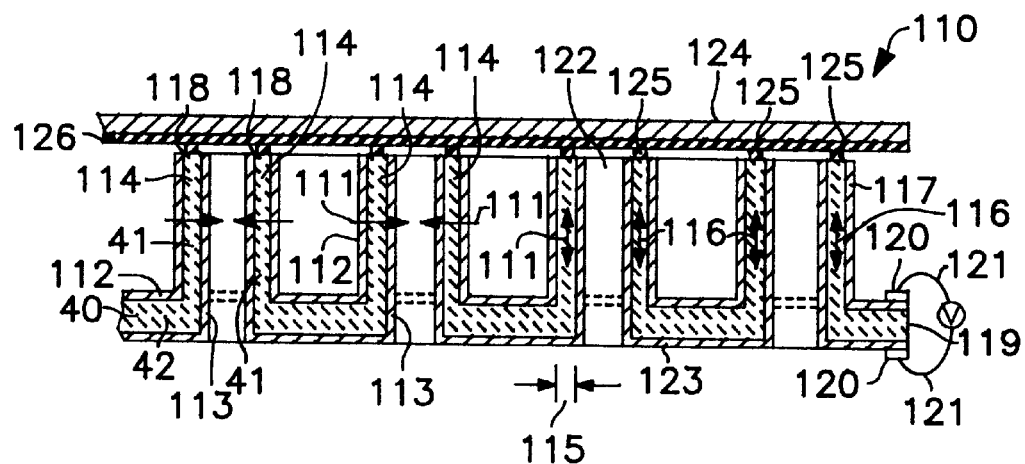
FIG. 12 is a cross-sectional elevation view of a portion of an actuator array device in accordance with another embodiment of the invention.

An illustrative alternate piezoelectric actuator, in which the enclosures are not filled, is shown in FIG. 12. The vibration transmitting means is provided by a cover plate, as described below. No strain amplification is provided by this embodiment. Actuator 110 includes piezoelectric ceramic blank or body 40, similar to the sintered ceramic blank shown in FIG. 4. Ceramic body 40 is made up of an array of a plurality of ceramic tubes 41 extending from ceramic base 42 in a direction normal to the plane of the base. Base 42 interconnects tubes 41 to one another and acts to support and stiffen the actuator. Using the net-shape forming process described above, piezoelectric or electrostrictive ceramic tubes may be co-formed with this supporting ceramic base to be unitary therewith. Tubes 41 are poled, as shown by arrows 111, in a $d_{31}$ configuration, i.e., in a direction across the thickness of the tube walls.

Electrodes 112 and 113 are provided on the outer and inner surfaces, respectively, of tube walls 114 for driving the tube walls across their thickness 115, causing vibration in the tube walls in a direction normal to the plane of base 42, as shown by arrows 116. In this embodiment the outer electrodes also cover the troughs between tubes, while the inner electrodes extend onto the base lower surface. These electrodes may be applied by coating the entire sintered ceramic body 40 with conductive coating 117, removing or masking the portions of coating 117 covering all of tube upper edges 118 and all around base outer edge 119 to electrically isolate electrode 112 from electrode 113. Optionally, the lower surface of base 42 may also be masked or portions of electrodes 113 extending onto base 42 removed to isolate individual elements or groups of elements from one another, as shown in FIG. 9. Electrodes 112 and 113 are connected to a source of electrical power by conventional means, e.g., via contacts 120 and wires 121.

As is illustrated in FIG. 12, the geometry of the preferred ceramic body of FIG. 4 provides a ready and cost effective means of electroding the actuator. Cylindrical openings 122 extend completely through ceramic blank 40 from upper tube edges 118 to lower surface 123 of base 42. Inner electrode 113 extends through each tube 41, coating openings 122, and over lower surface 123, permitting versatility in electroding and driving the actuator without complicated wiring or undue cost. The tubes may be driven collectively using a single, common electrode 113. Alternatively, a similar device may be fabricated having tube elements electroded similarly to those shown in FIG. 3B or FIG. 3C. In such an embodiment, an electrically conductive cover plate may be bonded, e.g., with conductive adhesive, to the electrode portion covering the upper surfaces of the tube walls. Thus, the cover plate may be used as an electrical connector for one electrode of each tube. Also alternatively, the portion of electrode 113 covering lower surface 123 of base 42 may be etched, masked, or otherwise patterned to isolate the tubes or groups of the tubes from one another, as described above for actuator 60b of FIG. 11. Separate contacts may be attached at lower surface 123 to drive sections of the actuator or individual tube elements 41 independently from one another.

Stiff cover plate 124 is bonded to tube upper edges 118 to extend across the upper surface of actuator 110. Cover plate 124 may be of any stiff material suitable for use in actuators, e.g., stiff metal, polymer, or polymer composite such as GRP circuit board material, and may be bonded to edges 118 by any suitable adhesive, as adhesive 125. However, the bonding material and cover plate must not interfere with the electrical isolation of electrodes 112 and 113 from one another. The preferred adhesive 125 for the embodiment shown in FIG. 12 is electrically insulating. In the case of a metal or other conductive cover plate, the lower surface of the cover plate may be provided with layer 126 of insulating material. Alternatively, the tube actuator elements may be electroded as shown in FIG. 3B or FIG. 3C. In either of these alternate embodiments, the cover plate may be electrically conductive and bonded with a conductive material directly to one electrode at the upper surface of the tube walls to act as an electrical connector for that electrode. The vibration of tube walls 114 drives cover plate 124 to vibrate, which, in turn, creates an acoustic wave in the desired medium, e.g., water. Optionally, the tubes may be closed or capped at upper surfaces 118, and cover plate 124 bonded to the closed end or cap.

Figure 13:
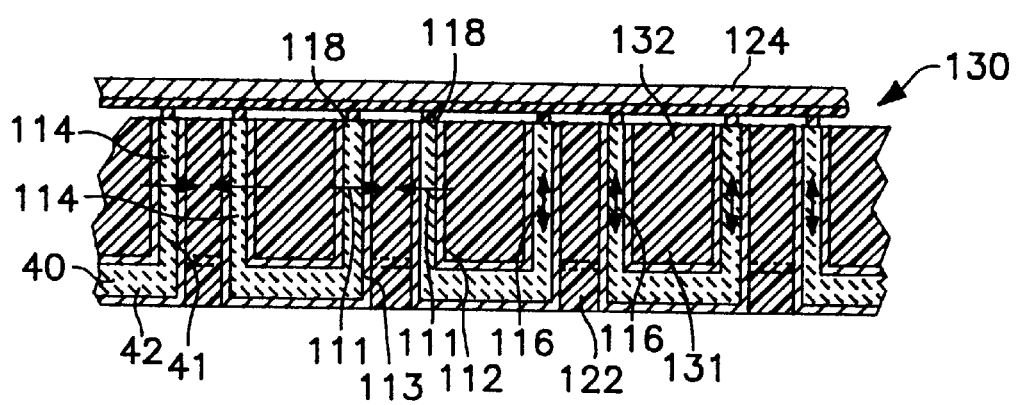
FIG. 13 is a cross sectional elevation view of a portion of an actuator array device in accordance with yet another embodiment of the invention.

FIG. 13 shows another illustrative actuator device filled with a soft compressible polymer. Like features to those shown in FIG. 12 are indicated by the same reference numerals. Actuator 130 includes piezoelectric ceramic body 40 made up of ceramic tubes 41 extending from ceramic base 42. Tubes 41 are poled to operate in a $d_{31}$ configuration. Electrodes 112 and 113 are provided on the outer and inner surfaces, respectively, of tube walls 114, as described above. Electrodes 112 and 113 may be connected to a source of electrical power by conventional means.

Cylindrical openings 122 and troughs 131 between tubes 41 are filled, e.g., by casting, with soft compressible elastomeric polymer 132, e.g., a soft polyurethane or rubber of low Shore hardness. Polymer 132 fills and surrounds the tubes for shock resistance. The polymer may include voids or be filled with air-filled microballoons to increase compressibility and the mechanical shock-absorbing capabilities of the polymer. Polymer 132 preferably is an electrically insulating polymer selected to form a weak bond to ceramic body 40.

On activation, the actuator is driven across the thickness of the tube walls, causing vibration in the tube walls in a direction normal to base 42 of the actuator, i.e., in the $d_{31}$ mode. Because of the compressibility of the polymer and the weak bond between the polymer and the tube walls, polymer 132 does not vibrate significantly with the tube walls. Cover plate 124, bonded to tube upper edges 118, is driven to vibrate with tube edges 118, creating an acoustic wave in the desired medium. The alternative embodiments described above for the device of FIG. 12 in which the cover plate is electrically conductive may also be adapted to the soft polymer filled device of FIG. 13 to provide an electrical connection for one electrode of each element.

Any of the above-described actuators may be operated in either ac or pulsed dc mode, as described above. Also, any of the above-described actuators may be operated in the reverse, i.e., receiver mode. Acoustic radiation striking the polymer surface or cover plate causes flexing of the actuator walls which, in turn, generates a current in the electrodes which can be detected and amplified by conventional means.

Figure 14:
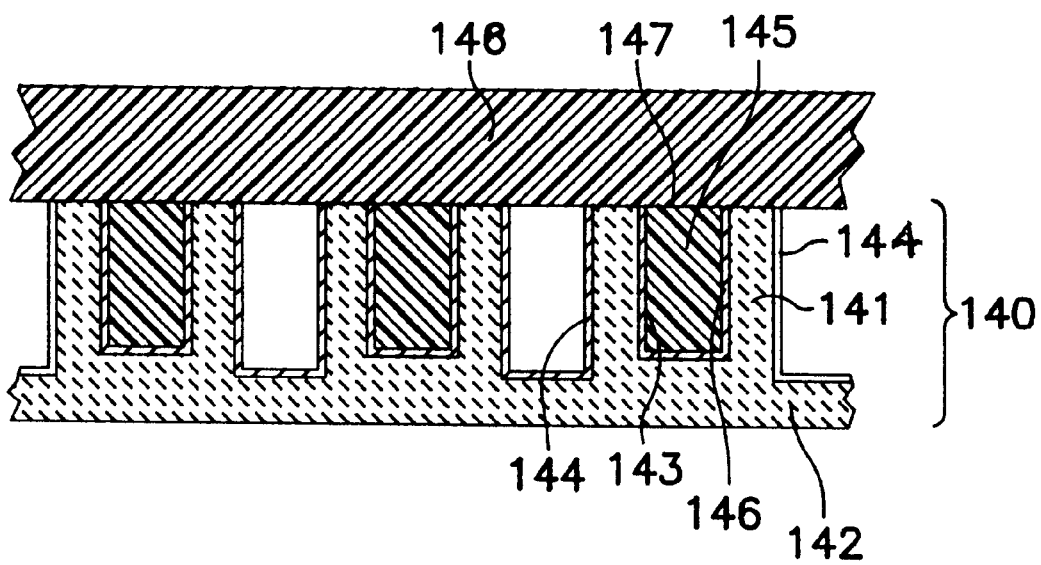
FIG. 14 is an example of an acoustic receiver.

An example of an acoustic receiver is shown in FIG. 14. Sensor device 140 includes an array of tube walls 141 mounted on base 142. Electrodes 143 and 144 are bonded to opposing sides of the tube walls. Compliant filler polymer material 145 fills enclosures 146 defined by walls 141 and base 142. A polymeric or rubber mount 148 is bonded to upper surfaces 146 of polymer filler 145. Vibration in mount 148 is transmitted to walls 141 via polymer filler 145, generating a current in the electrodes which may be detected by conventional means.

The devices and methods described herein provide low voltage actuators and sensors which are readily fabricated at reasonable cost, are rugged, and may incorporate integral strain amplification. The devices may be adapted to meet a variety of application requirements including but not limited to non-destructive testing and evaluation, bubble detection within a fluid, sonification of a fluid for droplet or mist generation, ultrasonic processing and positioning, and detection and measurement of fluid levels or flow characteristics.

While there has been shown and described what are at present considered the preferred embodiments of the invention, it will be apparent to those skilled in the art that modifications and changes can be made therein without departing from the scope of the present invention as defined by the appended claims.

We claim:

1. A piezoelectric actuator comprising:
   one or more piezoelectric or electrostrictive ceramic walls defining an enclosure, wherein said walls are poled for operation in a $d_{15}$ or a $d_{31}$ configuration such that activation of said actuator causes vibration of said walls;
   a rigid base supporting said walls;
   a first electrode bonded to surfaces of said walls facing said enclosure; and
   a second electrode bonded to surfaces of said walls opposite said enclosure-facing wall surfaces;
   said actuator further comprising:
   vibration transmitting means for transmitting said wall vibration to a desired medium in a direction of acoustic radiation.

2. An actuator in accordance with claim 1 wherein said one or more walls are provided by a ceramic tube; said walls are poled for operation in a $d_{31}$ orientation; said enclosure is unfilled or is filled with a soft, compressible, elastomeric polymer selected to absorb acoustic radiation; and said vibration transmitting means comprises a cover plate extending over said tube and bonded to upper surfaces of said tube walls to transmit vibration of said walls to said desired medium in said direction of acoustic radiation.

3. An actuator in accordance with claim 2 wherein either said first electrode or said second electrode includes an electrode upper portion extending over said upper surfaces of said tube walls; and said cover plate is bonded to said upper surfaces of said tube walls via said electrode upper portion.

4. An actuator in accordance with claim 1 wherein said enclosure is open in said direction of acoustic radiation.

5. An actuator in accordance with claim 4 wherein an end of said enclosure opposite to said direction of acoustic radiation is a closed end, said enclosure being further defined by said closed end.

6. An actuator in accordance with claim 5 wherein said vibration transmitting means comprises a compliant polymeric filler material filling said enclosure, bonded to said walls, and constrained by said walls and said closed end; said polymeric filler material has a stiffness of Shore A30 to Shore D75; said wall vibration causes vibration of an unconfined surface of said filler material in said direction of acoustic radiation; and said filler material, poling and dimensions of said walls, and dimensions of said enclosure are selected to provide, on activation of said actuator, strain amplification in said actuator.

7. An actuator in accordance with claim 6 wherein said filler material, poling and dimensions of said walls, and dimensions of said enclosure are selected to provide, on activation of said actuator, acoustic impedance matching of said actuator to said medium.

8. An actuator in accordance with claim 7 wherein said medium is water.

9. An actuator in accordance with claim 7 wherein said medium is a mechanical structure of known acoustic impedance.

10. An actuator in accordance with claim 9 wherein said mechanical structure is a rubber mount.

11. An actuator in accordance with claim 6 wherein said walls are provided by a ceramic tube, said filler material consequently being cylindrical in shape; and said walls are poled for operation in a $d_{31}$ configuration.

12. An actuator in accordance with claim 11 wherein dimensions of said tube are as follows: said height is 1–100 mm, said wall thickness is 0.1–5 mm, and the outside diameter of said tube is 0.5–50 mm.

13. An actuator in accordance with claim 6 wherein said walls are provided by a parallel pair of rectangular ceramic blades, said filler material consequently being a rectangular laminar layer between said blades.

14. An actuator in accordance with claim 13 wherein dimensions of said ceramic blades are as follows: said height is 1—100 mm, said wall thickness is 0.1–5 mm, and said enclosure is 0.1–50 mm wide between said blades.

15. An acoustic device comprising an array of parallel piezoelectric actuator elements extending from and interconnected by a rigid base, each of said actuator elements comprising:
   one or more piezoelectric or electrostrictive ceramic walls defining an enclosure, said rigid base supporting said walls; wherein said walls are poled for operation in a $d_{15}$ or a $d_{31}$ configuration such that activation of said actuator causes vibration of said walls;
   a first electrode bonded to surfaces of said walls facing said enclosure; and
   a second electrode bonded to surfaces of said walls opposite said enclosure-facing wall surfaces;
   said actuator further comprising:
   vibration transmitting means for transmitting said wall vibration to a desired medium in a direction of acoustic radiation.

16. A device in accordance with claim 15 wherein said one or more walls of each actuator element are provided by a ceramic tube; said walls are poled for operation in a $d_{31}$ orientation; said enclosure is unfilled or is filled with a soft, compressible, elastomeric polymer selected to absorb acoustic radiation; and said vibration transmitting means comprises a cover plate extending over said tubes and bonded to upper surfaces of said tube walls to transmit vibration of said walls to said desired medium in said direction of acoustic radiation.

17. A device in accordance with claim 15 wherein either each of said first electrodes or each of said second electrodes includes an electrode upper portion extending over said upper surfaces of said tube walls; and said cover plate is bonded to said upper surfaces of said tube walls via said electrode upper portions.

18. A device in accordance with claim 15 wherein said enclosure is open in said direction of acoustic radiation.

19. A device in accordance with claim 18 wherein an end of each of said enclosures opposite to said direction of acoustic radiation is a closed end, each of said enclosures being further defined by said closed end.

20. A device in accordance with claim 19 wherein said vibration transmitting means comprises a compliant polymeric filler material filling said enclosure of each of said actuator elements; wherein said compliant filler material is bonded to said walls and constrained by said walls and said closed end; said compliant filler material has a stiffness of Shore A30 to Shore D75; said vibration of said walls of each of said actuator elements causes vibration of an unconfined surface of said filler material in each of said cavities in said direction of acoustic radiation; and said filler material, poling and dimensions of said walls, and dimensions of said enclosures are selected to provide, on activation of said device, strain amplification in said device.

21. A device in accordance with claim 20 wherein said filler material, poling and dimensions of said walls, dimensions of said cavities, and said voltage are selected to provide, on activation of said array, acoustic impedance matching of said device to said medium.

22. A device in accordance with claim 21 wherein said medium is water.

23. A device in accordance with claim 21 wherein said medium is a mechanical structure of known acoustic impedance.

24. A device in accordance with claim 23 wherein said mechanical structure is a rubber mount.

25. A device in accordance with claim 20 wherein said walls of each of said actuator elements are provided by a ceramic tube, said filler material of each element consequently being cylindrical in shape; and said walls are poled for operation in a $d_{31}$ configuration.

26. A device in accordance with claim 25 wherein the dimensions of each of said tubes are as follows: said height is 1–100 mm, said wall thickness is 0.1–5 mm, and the outside diameter is 0.5–50 mm.

27. A device in accordance with claim 20 wherein said walls of each actuator are provided by a parallel pair of rectangular ceramic blades, said filler material of each element consequently being a rectangular laminar layer between said blades.

28. A device in accordance with claim 27 wherein the dimensions of said ceramic blades of each of said actuator elements are as follows: said height is 1–100 mm, said wall thickness is 0.1–5 mm, and said enclosure is 0.1–50 mm wide between said blades.

29. A device in accordance with claim 27 wherein said enclosure of each of said actuator elements is further defined by at least one lateral support which cooperates with said walls and said base to constrain said filler material.

30. A device in accordance with claim 20 further including a stiff cover plate bonded to said compliant filler material unconfined surface of each of said elements and extending in a direction generally normal to said direction of acoustic radiation.

31. A device in accordance with claim 20 wherein each of said actuator elements is electrically interconnected to a voltage source to operate independently of at least some others of said elements in said array.

32. An acoustic device comprising an array of parallel piezoelectric acoustic sensor elements extending from and interconnected by a rigid base, each of said sensor elements comprising:

one or more piezoelectric or electrostrictive ceramic walls defining an enclosure, said rigid base supporting said walls; wherein said enclosure is open in a direction to receive acoustic radiation; and said walls are poled for operation in a $d_{15}$ or a $d_{31}$ configuration;

a first electrode bonded to surfaces of said walls facing said enclosure; and a second electrode bonded to surfaces of said walls opposite said enclosure-facing wall surfaces;

said acoustic device further comprising:

vibration transmitting means for transmitting said acoustic radiation, causing vibration in said walls in response to said transmitted acoustic radiation and producing an electrical signal.

33. An acoustic device in accordance with claim 32 wherein an end of each of said enclosures opposite to a direction of said acoustic radiation is a closed end, each of said enclosures being further defined by said closed end; said vibration transmitting means comprises a compliant polymeric filler material filling said enclosures, bonded to said walls, and constrained by said walls and said closed end such that said acoustic radiation causes vibration of an unconfined surface of said filler material of each of said sensor elements in response to said acoustic radiation, said vibration of said unconfined surface, in turn, causing vibration of said walls of each of said actuators and producing an electrical signal.

34. A device in accordance with claim 32 wherein said first electrode is electrically patterned at a surface of said base to provide electrical circuitry for electrically connecting individual ones of said sensor elements or groups of said sensor elements independently of others of said sensor elements or groups of sensor elements.

35. A device in accordance with claim 32 wherein said one or more walls of each sensor element are provided by a ceramic tube; said walls are poled for operation in a $d_{31}$ orientation; said enclosure is unfilled or is filled with a soft, compressible, elastomeric polymer selected to absorb acoustic radiation; and said vibration transmitting means comprises a cover plate extending over said tubes and bonded to upper surfaces of said tube walls.

* * * * *